(12) United States Patent
Ferrarini et al.

(10) Patent No.: US 11,569,017 B2
(45) Date of Patent: Jan. 31, 2023

(54) DIAGNOSTIC DEVICE AND METHOD FOR SOLENOID VALVES

(71) Applicant: CAMOZZI AUTOMATION S.P.A., Brescia (IT)

(72) Inventors: Dario Ferrarini, Brescia (IT); Andrea Camisani, Brescia (IT)

(73) Assignee: CAMOZZI AUTOMATION S.P.A., Brescia (IT)

( * ) Notice: Subject to any disclaimer, the term of this patent is extended or adjusted under 35 U.S.C. 154(b) by 407 days.

(21) Appl. No.: 16/631,605

(22) PCT Filed: Aug. 28, 2018

(86) PCT No.: PCT/IB2018/056551
§ 371 (c)(1),
(2) Date: Jan. 16, 2020

(87) PCT Pub. No.: WO2019/043573
PCT Pub. Date: Mar. 7, 2019

(65) Prior Publication Data
US 2020/0217894 A1     Jul. 9, 2020

(30) Foreign Application Priority Data

Aug. 29, 2017   (IT) .................... 102017000096979

(51) Int. Cl.
*H01F 7/18*   (2006.01)
*F16K 37/00*   (2006.01)
(Continued)

(52) U.S. Cl.
CPC .......... *H01F 7/1844* (2013.01); *F16K 11/044* (2013.01); *F16K 31/0627* (2013.01);
(Continued)

(58) Field of Classification Search
CPC ............ F16K 31/0675; F16K 37/0083; F16K 37/0091; Y10T 137/8158; Y10T 137/8326
(Continued)

(56) References Cited

U.S. PATENT DOCUMENTS 11,322,283 B2 *   5/2022   Ferrarini ............ F16K 37/0083
2009/0266152 A1   10/2009   Hein
2016/0125993 A1    5/2016   Narayanasamy et al.

FOREIGN PATENT DOCUMENTS

DE        3807278 A1 *   9/1989   ............... H01F 7/18
DE        19821804 C1     8/1999
(Continued)

OTHER PUBLICATIONS

International Search Report and Written Opinion for International Patent Application No. PCT/IB2018/056551, dated Jan. 4, 2019, 11 pages.

*Primary Examiner* — Matthew W Jellett
(74) *Attorney, Agent, or Firm* — Armstrong Teasdale LLP (57) ABSTRACT

A diagnostic method for solenoid valves includes detecting, at excitation of the solenoid, a variation rate of the supply voltage of the solenoid and comparing it with a predetermined value, generating an error signal if the variation rate is lower than the predetermined value, otherwise, detecting characteristics of the waveform of the solenoid current over a time interval between a moment of excitation of the solenoid and a moment wherein the movable core reaches end-stroke position, comparing the detected characteristics with threshold values, generating an alarm signal if the detected characteristics are lower than the threshold values, otherwise calculating the value of solenoid resistance and comparing it with a minimum resistance value and a maximum resistance value when the solenoid current is in steady state, and generating an alarm signal if the solenoid resis- (Continued)

tance value is lower than the minimum resistance value or greater than the maximum resistance value.

18 Claims, 9 Drawing Sheets

(51) Int. Cl.
    *F16K 11/044*     (2006.01)
    *F16K 31/06*     (2006.01)
    *G01R 31/327*     (2006.01)
    *G01R 31/28*     (2006.01)
    *G01R 31/72*     (2020.01)

(52) U.S. Cl.
    CPC ...... *F16K 37/0083* (2013.01); *G01R 31/2829* (2013.01); *G01R 31/3278* (2013.01); *G01R 31/72* (2020.01); *H01F 2007/1855* (2013.01); *H01F 2007/1861* (2013.01)

(58) Field of Classification Search
    USPC ........................................ 251/129.04, 129.15
    See application file for complete search history.

(56) References Cited

FOREIGN PATENT DOCUMENTS

| | | | | |
|---|---|---|---|---|
| DE | 102014216610 A1 | | 2/2016 | |
| EP | 2551684 A1 | * | 1/2013 | ........... G01R 31/025 |

* cited by examiner

DIAGNOSTIC DEVICE AND METHOD FOR SOLENOID VALVES

CROSS-REFERENCE TO RELATED APPLICATIONS

This application is a National Phase filing of PCT International Application No. PCT/IB2018/056551, having an International Filing Date of Aug. 28, 2018, claiming priority to Italian Patent Application No. 102017000096979, having a filing date of Aug. 29, 2017 each of which is hereby incorporated by reference in its entirety.

FIELD OF THE INVENTION

The present invention concerns a diagnostic device for solenoid valves.

BACKGROUND OF THE INVENTION

Figure 1:
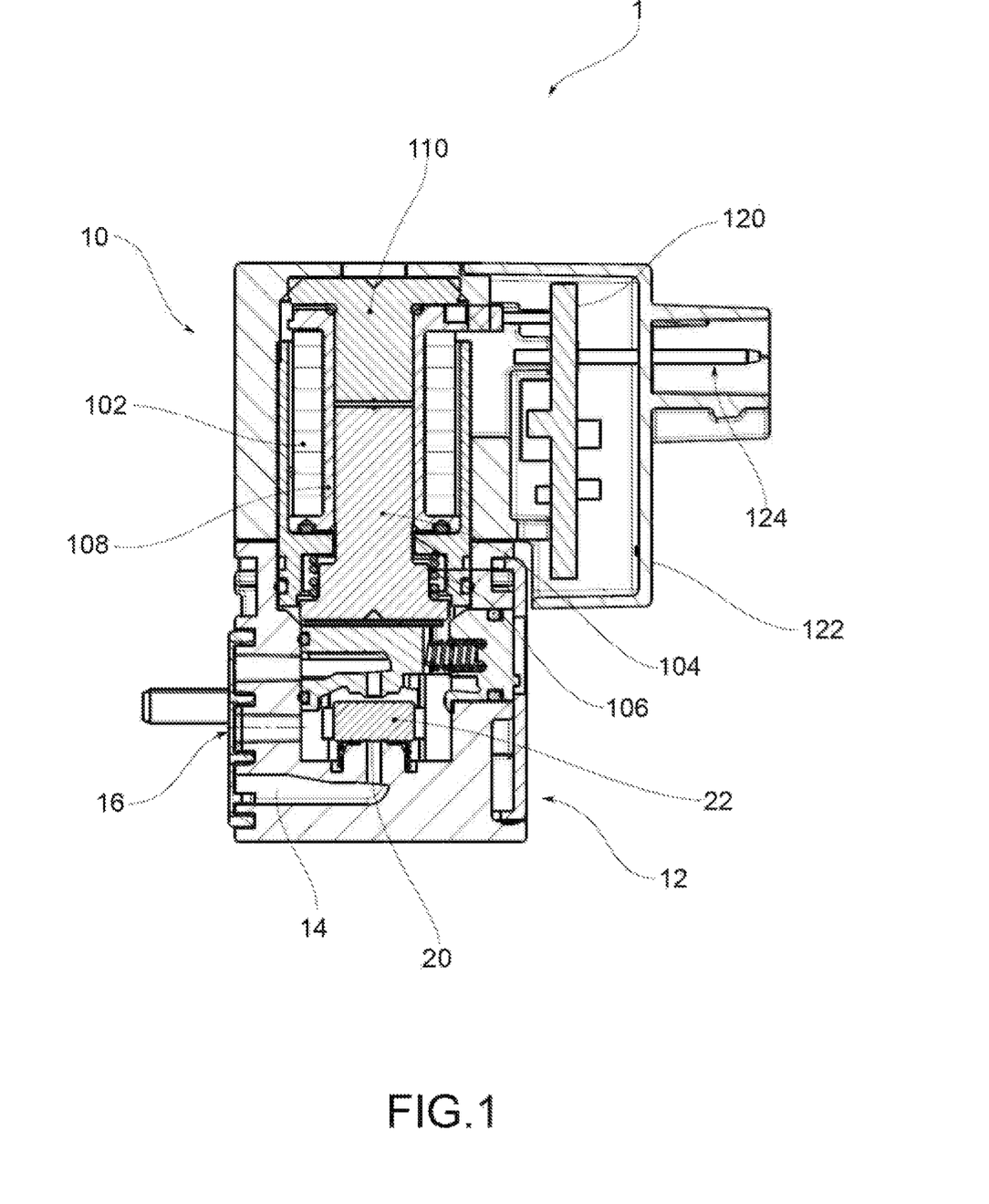
FIG. 1 is a sectional view of a solenoid valve according to the state of the art.

As illustrated in the example in FIG. 1, a solenoid valve 1, or electromagnetic valve, is typically composed of an electromagnet 10 and a valve body 12, wherein one or more orifices are made.

The electromagnet 10 comprises a solenoid 102 wherein is situated and slidable a movable core 104 made of ferromagnetic material. The flow through an orifice of a fluid intercepted by the solenoid valve, e.g. compressed air, is blocked or allowed by the movement of the movable core 104 when the solenoid is electrically powered or is deactivated.

When the solenoid 102 is powered, the movable core 104 directly opens the orifice of a normally closed valve (NO) or closes the orifice of a normally open valve (NO). When the solenoid is deactivated, a spring 106 returns the core to the original position thereof.

The valve operates in a pressure range from 0 bar to the maximum pressure rating. The force required to open the valve is proportional to the cross-section of the orifice and the pressure of the fluid.

In the field of pneumatics for industrial automation, the performance of pneumatic components is increasingly high and must be guaranteed over time. In some applications, pneumatic components need to be replaced as soon as performance declines.

In particular, there is an increasing need to monitor the behavior of solenoid valves to detect possible malfunctions or a significant reduction in the performance thereof.

SUMMARY OF THE INVENTION

The object of the present invention is to meet such need by providing a diagnostic device capable of monitoring the performance of a solenoid valve to detect a deviation from the expected values thereof, for example, due to a malfunction or degradation due to wear.

Another purpose of the invention is to propose a diagnostic device that is also able to provide an indication of a possible cause of the malfunction of a solenoid valve.

Another purpose of the invention is to propose a diagnostic device suitable to be implemented directly on a solenoid valve, also—when possible—as an accessory to be applied to an existing solenoid valve.

These and other objects and advantages of the invention are achieved by a diagnostic method, a diagnostic device, and a solenoid valve as described and claimed herein.

In one embodiment, the diagnostic method comprises the steps of:

a) detecting, at the excitation of the solenoid, the rate of variation over time (dV/dt) of the supply voltage of the solenoid and comparing it with a predetermined value;

b) if said variation rate is less than said predetermined value, generating an error signal, otherwise, c) detecting the characteristics of the waveform of the solenoid current over a time interval between the solenoid's moment of excitation and the moment wherein the movable core reaches the end-stroke position;

d) comparing the characteristics of the waveform detected with predetermined threshold values;

e) if the detected characteristics are less than said predetermined threshold values, generating an alarm signal, otherwise f) when the solenoid current is in steady state, calculating the value of solenoid resistance (R) and comparing it with a predetermined minimum resistance value and with a predetermined maximum resistance value;

g) if the value of the solenoid resistance is less than the predetermined minimum resistance value or greater than the predetermined maximum resistance value, generating an alarm signal.

According to one aspect of the invention, step c) comprises a calculation of the derivative of the solenoid current over time (dI/dt) in a time range that includes or is contiguous to that wherein the peak and the valley of the waveform of the solenoid current occur, said peak and said valley being generated, respectively, by the engagement of the movable core and by the attainment of the end-stroke position of the movable core. In step d) the values of said derivatives are compared with the respective predetermined values.

According to a variant embodiment, the characteristics of the waveform of the solenoid current comprise at least the first time interval that elapses between the moment of excitation of the solenoid and the moment of the peak current generated by the engagement of the movable core.

According to one aspect of the invention, the predetermined threshold values of the waveform are obtained from the waveform of the solenoid current acquired when the solenoid valve is in a testing stage during or after release from the factory.

In one variant embodiment, the predetermined threshold values are obtained from mean values relating to a previously acquired set of values of the waveform of the solenoid current.

According to one aspect of the invention, if the characteristics of the detected waveform are less than the predetermined threshold values, a comparison between the pressure value of the fluid entering the inlet orifice of the solenoid valve and a range of predetermined pressure values is made, for example, by means of a control unit external to the solenoid valve. In the event of deviation of the pressure value with respect to such range of predetermined pressure values, the fluid pressure value is regulated and a repetition of steps c) and d) is commanded.

According to one aspect of the invention, the diagnostic device comprises a microcontroller-based electronic diagnostic circuit configured to implement the diagnostic method described above. Preferably, the diagnostic circuit is implemented on a power supply and control circuit board suitable to be mounted on the solenoid valve.

In one embodiment, the device comprises communication means suitable for implementing communication between the microcontroller of the electronic diagnostic circuit and an external control unit, for example, to carry out the pressure control, as described above, and to command a repetition of the verification of the waveform of the solenoid current after adjusting the pressure.

In one embodiment, the communication means are suitable to transmit a status signal to the external control unit, which may assume at least two logical levels representative of the operational state of the solenoid valve. Therefore, a single cable or channel is sufficient to implement a communication protocol with the external control unit.

In one embodiment, in addition to or as an alternative to the means of communication with an external control unit, the diagnostic device is equipped with visual signaling means, such as LEDs, suitable for displaying the status of the solenoid valve, for example by means of various flashing frequencies.

A solenoid valve according to an aspect of the present Invention comprises a power supply and control circuit board whereon the diagnostic device described above is implemented.

For example, the power supply and control circuit board is equipped with an electrical connector having a pair of power supply terminals and an electrical diagnostic terminal connectable to an external control unit.

BRIEF DESCRIPTION OF THE DRAWINGS

Further features and advantages of the device and of the diagnostic method according to the invention will, in any case, become evident from the description provided hereinafter of the preferred embodiments thereof, provided by way of indicative and non-limiting example, with reference to the accompanying figures, wherein.

DETAILED DESCRIPTION

Figure 2:
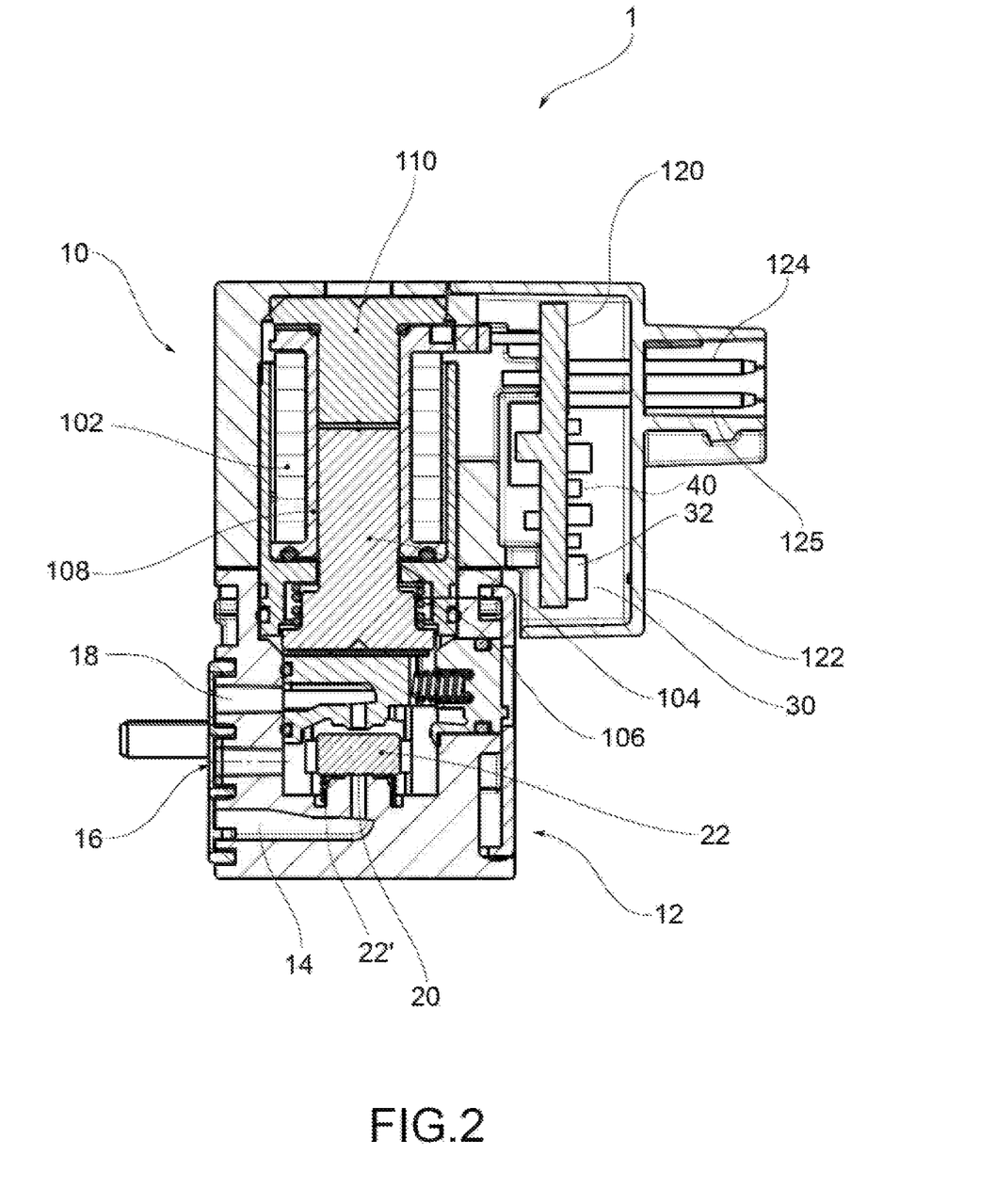
FIG. 2 is a sectional view of a solenoid valve equipped with a diagnostic device according to the invention.

FIG. 2 shows a solenoid valve 1 equipped with a diagnostic device according to the invention.

The solenoid valve 1 comprises an electromagnet 10 and a valve body 12 wherein an inlet orifice 14, an outlet orifice 16 and a discharge passage 18 are made.

The inlet orifice 14 forms a valve seat 20 to which is associated a sealing valve element 22 that may be moved between a closed position and an open position of the valve seat 20.

The electromagnet 10 comprises a solenoid 102 wound on a coil 108 and a magnetic circuit formed of a fixed armature 110 having, for example, a portion that partially penetrates the axial sleeve of the coil 108, and a movable core 104, which also partially penetrates in the sleeve.

The valve element 22 may be constructed as an integral part of the movable core 104 or as a separate element. In some embodiments, the sealing valve element 22 has a cylindrical base with comb teeth facing the movable core.

If the valve element is made as a separate element—as in the example in FIG. 2—a spring 22', placed under its cylindrical base, has the task of driving it towards the movable core 104 as the position of the latter changes.

The solenoid 102 has a pair of electrical terminals connected to a power supply and control circuit board 120 housed in a protective casing 122 integral with the electromagnet 10. In turn, the power supply and control circuit board 120 is provided with power supply terminals 124 suitable to be connected to a power supply connector.

In accordance with one aspect of the invention, the diagnostic device comprises an electrical diagnostic circuit 30 implemented on the power supply and control circuit board 120.

In a DC valve of the type described above, powered with a constant power supply voltage, for example 24V, 12V, or 5V, as soon as the solenoid 102 is energized, the current in the solenoid increases, causing an expansion of the magnetic field until it becomes sufficiently elevated to move the movable core 104. The movement of the movable core 104 increases the concentration of the magnetic field, as the magnetic mass of the core moves increasingly to the inside of the magnetic field.

Figure 3:
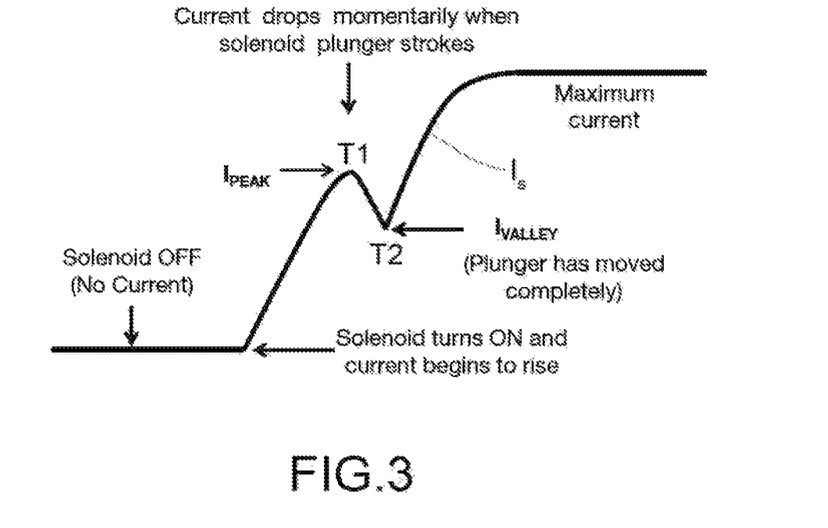
FIG. 3 is a graph representing a typical waveform of the solenoid current.

A magnetic field, which changes in the same direction as the current that generates it, induces a voltage of the opposite sign in the solenoid coils. Since the magnetic field expands rapidly as the movable core moves to the end-stroke position, such field causes a brief reduction in the current flowing through the coils of the solenoid. After the movable core has reached the end of its stroke, the current begins to increase again until it reaches its maximum level. A typical waveform of the solenoid current IS is shown in FIG. 3.

As long as no power supply voltage is applied to the solenoid, the solenoid current is zero.

When the solenoid is powered, there is a first increase of the solenoid current IS, until reaching, at the time T1, a peak value IPEAK, which, as stated, corresponds to the engagement of the movable core, i.e., the beginning of its stroke towards the fixed armature. The solenoid current then decreases until it reaches, at the moment T2, a minimum value IVALLEY, which corresponds to the abutment of the movable core against the fixed armature. At this point, the solenoid current begins to increase again until it reaches its maximum value.

The simplified equation of the solenoid of a solenoid valve could be represented as follows:

$$V = iR + \frac{d\Phi(i, x)}{dt}$$

where V is the voltage applied to the solenoid, R is the resistance of the solenoid and Φ expresses the variation in magnetic flux as a function of the current and the position (x) of the movable mechanical parts (movable core and fixed core, or armature).

The first term of the equation is relative to the change in resistance and the second term expresses the induced voltage.

The solenoid inductance depends on the position of the movable parts, because the magnetic reluctance of the solenoid depends on the position of the electromagnetic parts and therefore on the reclosing of the magnetic field itself.

The flux Φ in the coil depends on the current passing through the coil and the distance of the ferrous parts, according to the formula:

$$V = iR + \frac{\delta\phi(i, x)}{\delta i} * \frac{di}{dt} + \frac{\delta\phi(i, x)}{\delta x} * \frac{dx}{dt}$$

Being Φ=Li, the preceding relationship becomes:

$$V = iR + L(i, x) * \frac{di}{dt} + i * \frac{dL(i, x)}{dx} * \frac{di}{dt}$$

The third addend represents the counter-electromotive force induced by the movement of the ferrous parts.

Such relationship clearly expresses that the magnetic flux, and thus the attractive force of the solenoid valve, depend on the values, of the resistance R and the inductance L of the solenoid.

It is known, moreover, that the resistance R of a solenoid is given by the relationship $$R=\rho*l/S$$

where ρ is the average resistivity of the material, l is the length of the wire and S is the cross-section.

ρ and S may be assumed as constants, while the length l is subject to thermal expansion, which may be expressed in this way:

$$R=R(T0)*[1+\sigma(T-T0)]$$

where T0 is the temperature at 20° and σ is the material-dependent thermal coefficient.

Returning now to the waveform of the solenoid current, it may be observed that such waveform is substantially independent of the temperature.

On the other hand, it has been found that the waveform of the solenoid current, and in particular the time interval T1 between the solenoid excitation and the peak current IPEAK preceding the temporary drop, depends on the pressure of the fluid in the inlet orifice and/or on the wear of the solenoid valve, which is reflected, for example, in deformations of the sealing valve element, loss of spring force, friction.

Figure 4:
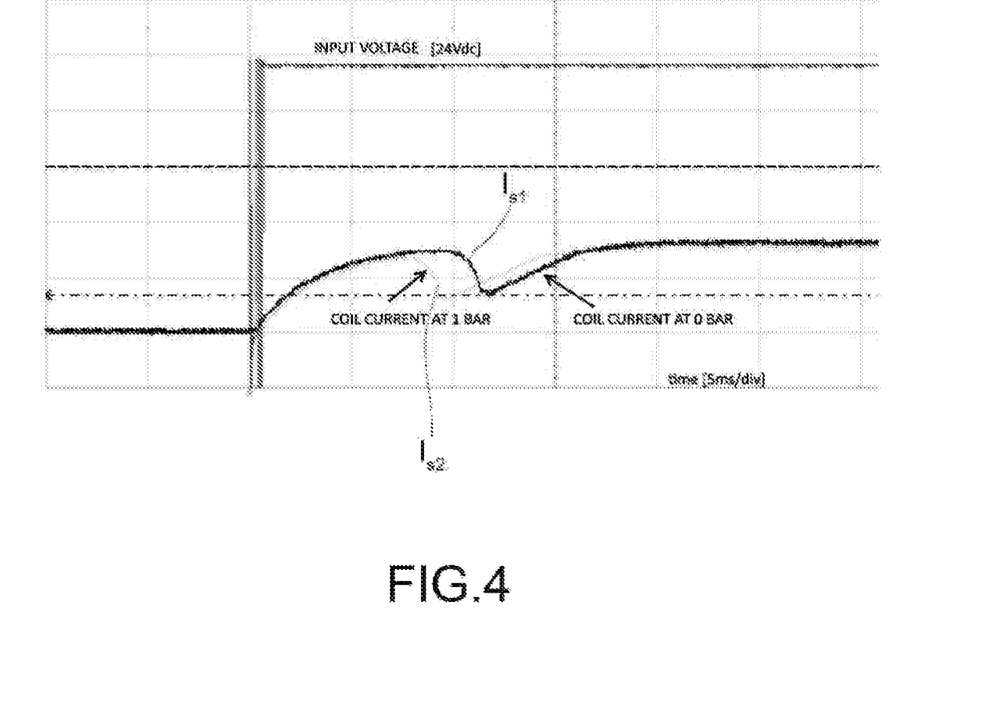
FIG. 4 shows, overlapping each other, the waveforms of the solenoid current with the solenoid valve at a pressure of 0 bar and a pressure of 1 bar.

For example, FIG. 4 shows the waveform of the solenoid current in the case of pressure at 0 bar (IS1) and in the case of pressure at 1 bar (IS2). Note that both the current peak IPEAK and the minimum value IVALLEY occur first in the case of higher pressure.

The idea behind this invention is therefore to store in non-volatile memory the reference characteristics of the waveform of the solenoid current, predetermined or pre-acquired, to detect these characteristics over time during the operation of the solenoid valve and to compare the reference characteristics with the detected characteristics in order to detect any deviations in the waveform of the present solenoid current compared to the reference waveform.

In one embodiment, the reference characteristics are characteristics of the waveform of the solenoid current acquired when the solenoid valve is in a test phase during or after release from the factory, i.e. at the beginning of the life cycle thereof.

In one variant embodiment, the reference characteristics are characteristics of the waveform of the solenoid current obtained from mean values relating to a previously acquired set of values and not necessarily the original set.

In the case of known and stabilized fluid pressure, for example from a pressure control system external to the solenoid valve, if the waveform of the solenoid current varies with respect to the reference waveform, one may conclude that the solenoid valve is deteriorating.

If, however, the pressure is not stabilized and the waveform changes, the cause of the change in the waveform may be due either to a change in the fluid pressure or to a deterioration of the solenoid valve.

In this situation, the diagnostic device may generate an alarm signal connected to a control unit, for example, a PLC, which controls the fluid pressure to stabilize it. In this case, the diagnostic device may be commanded to repeat the comparison of the waveform characteristics to check if the difference between the waveforms persists, which would indicate a deterioration of the solenoid valve, or if it is no longer present, which would mean that the solenoid valve works correctly and therefore it is necessary to stabilize the pressure.

In one embodiment, the characteristics of the waveform that are stored and compared are the slope of a first waveform segment between the moment of excitation of the solenoid valve and the first current peak and the slope of the second waveform segment between the peak current IPEAK and the next minimum point IVALLEY of the value of the solenoid current.

For example, the slope of the first segment is measured by calculating the ratio between the duration of the first time interval T1 of the waveform, i.e., the time interval between the moment of excitation of the solenoid and the current peak, and the difference between the value of the current at the current peak and the initial current, which is zero.

The slope of the second segment is estimated by calculating the ratio between the duration of the second time interval (T2-T1) of the waveform, i.e., the time interval between the moment T1 wherein the current peak occurs and the moment T2 wherein the current minimum value occurs, and the difference between the value of the current at the minimum value and the value of the current at the current peak.

In one embodiment, the values of the solenoid current are obtained by sampling the waveform at predetermined time intervals using a current sampling circuit.

Since in one advantageous embodiment, the diagnostic circuit 30 is implemented in the same power supply and control circuit board 120 already provided on the solenoid valve, such diagnostic circuit must be optimized in terms of bulk and therefore of size and number of electronic components. For example, the diagnostic circuit 30 comprises a microcontroller 32, the computing power and memory of which are selected so that they may be mounted on the power supply and control circuit board 120 without affecting the dimensions of the latter.

Therefore, even an existing solenoid valve may be equipped with a diagnostic device by simply replacing the traditional power supply and control circuit board with a power supply, control and diagnostic circuit board having the same size as the former.

For this purpose, in one embodiment, the microcontroller 32 compares each value of the sampled current received by the sampling circuit with the previous value of the sampled current and stores the sampled value in the memory only if the outcome of the comparison reveals the attainment of the peak current or of the minimum current.

In one variant embodiment, the diagnostic circuit is only suitable for comparing the engagement time T1 of the movable core, i.e. the first interval of time between the moment of excitation of the solenoid and the peak current moment.

Figure 5:
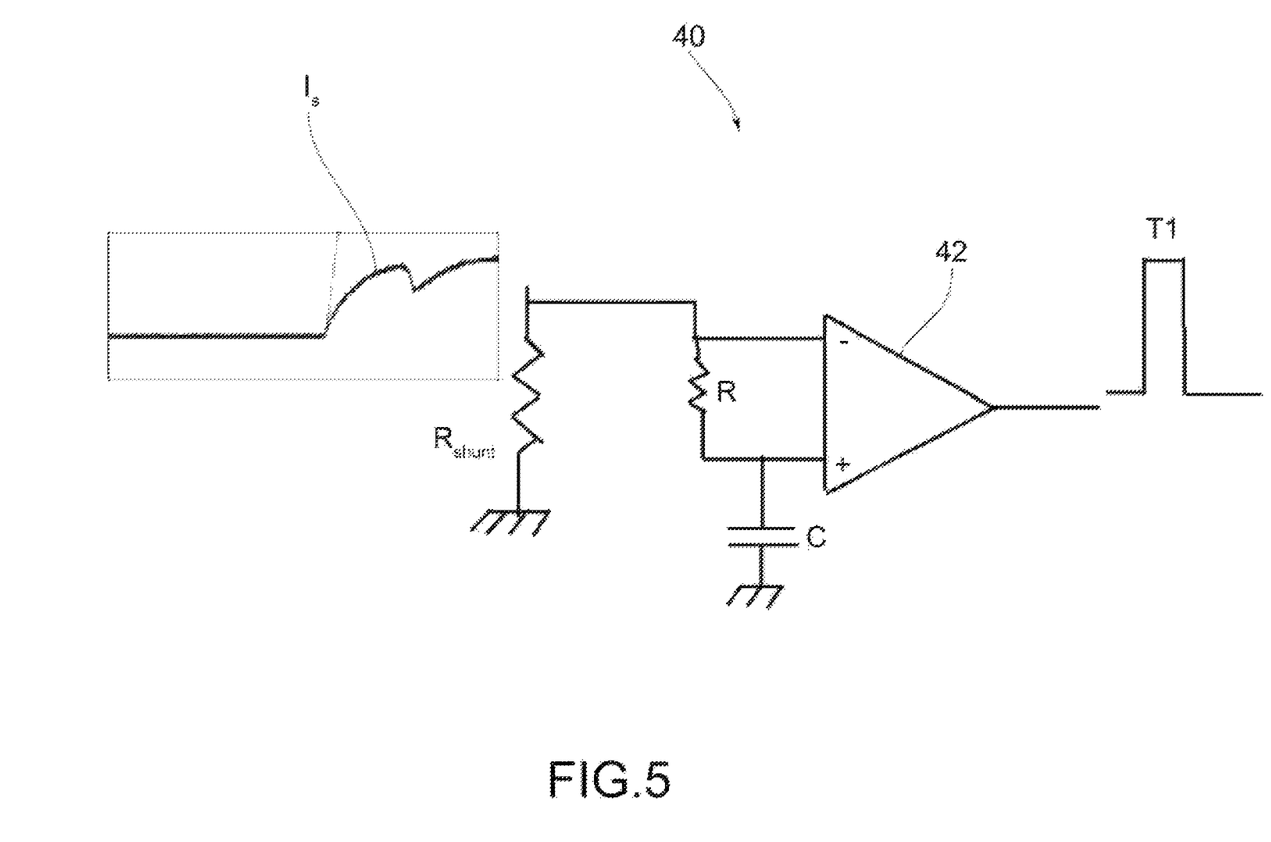
FIG. 5 is a circuit diagram of a detection circuit of the peak current of the waveform of the solenoid current.

To detect such time range, in one embodiment, the diagnostic device comprises an analog peak detection circuit 40, as shown in FIG. 5. In this circuit, the solenoid current detected by a shunt resistor RSHUNT (inverting input) and the solenoid current to which is applied a delay given by an RC network (non-inverting input) are fed to the input terminals of an operational amplifier 42 with comparator function. In this way, the circuit is able to detect the moment T1 wherein the solenoid current reaches the peak value IPEAK.

In one embodiment, the detection of the characteristics of the waveform of the solenoid current during operation of the solenoid valve comprises a verification of the change in the slope of the current waveform between the current peak (moment T1) and the minimum current value (moment T2). In effect, it has been found that any variation in the slope of this curve segment is particularly significant in terms of deterioration of the solenoid valve due to friction, corresponding to the phase of movement of the movable core.

Figure 6:
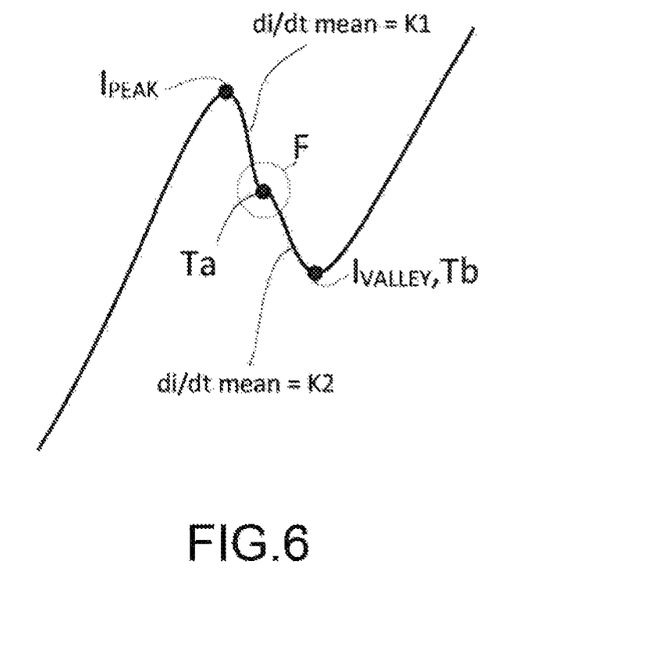
FIGS. 6 and 6a represent two graphs of the waveform of the solenoid current in the presence of friction between the movable core and the solenoid.
Figure 6A:
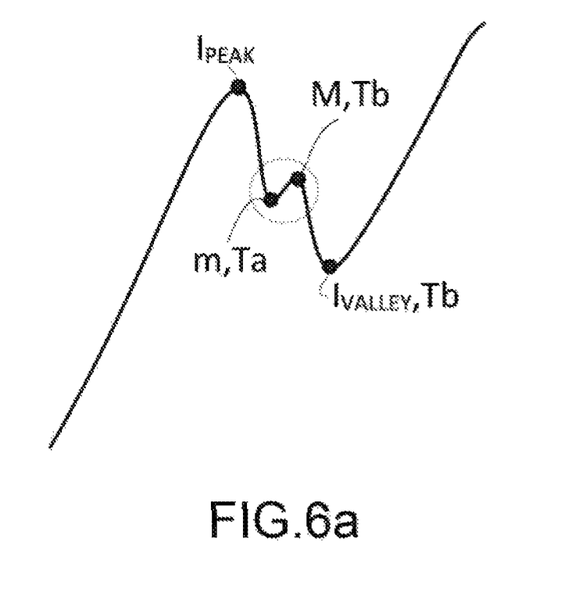

With reference to FIGS. 6 and 6a, slope variation refers in particular to the appearance of an inflection F (FIG. 6) or further relative maximum (M) and minimum (m) points (FIG. 6a), as in the waveform portions highlighted in the drawings.

Figure 7:
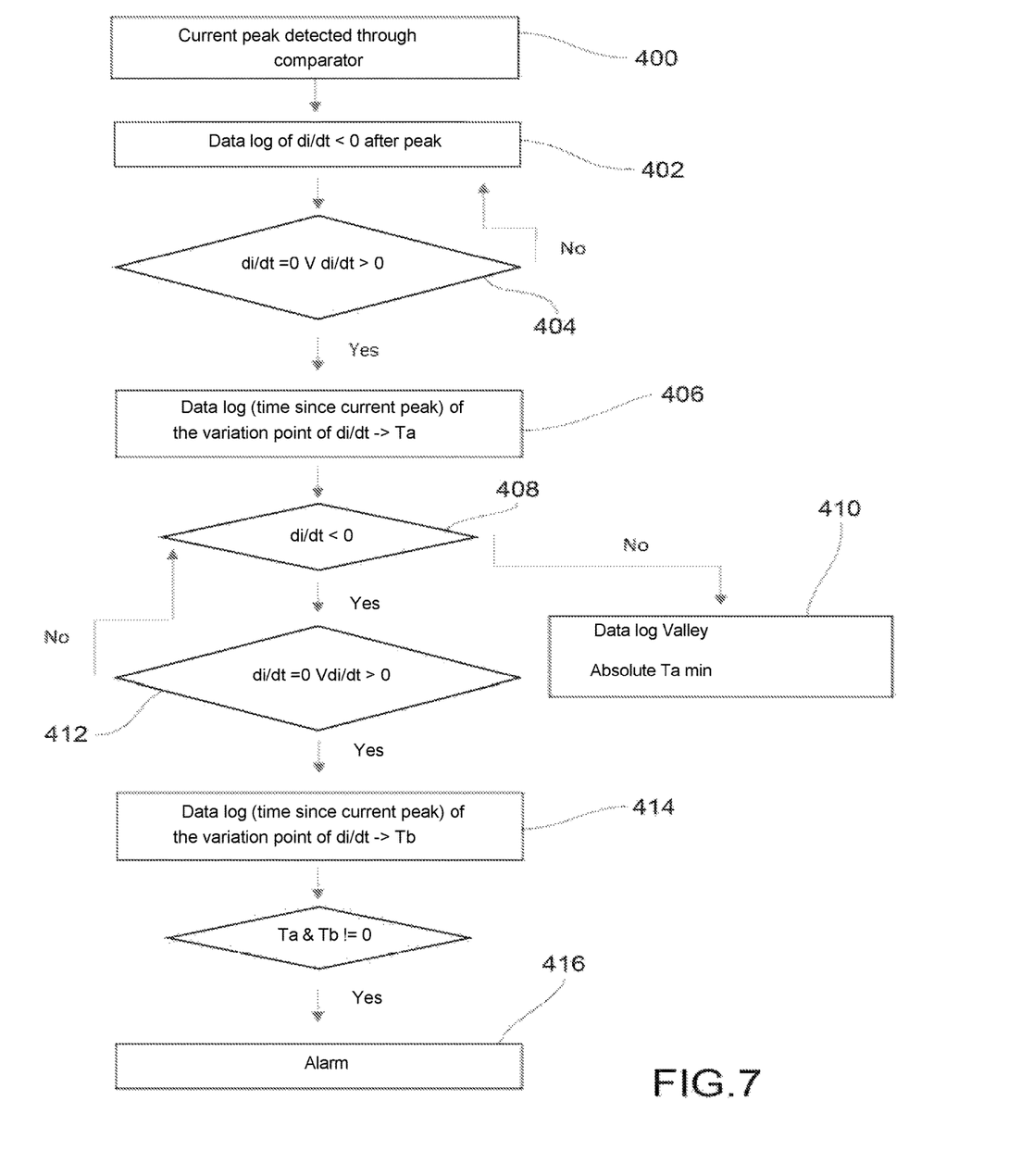
FIG. 7 is a flow diagram of a diagnostic algorithm, in one embodiment.

An example of a diagnostic protocol for this embodiment is shown in the flow chart in FIG. 7.

With reference to the flow diagram in FIG. 7, the current peak IPEAK (step 400) is detected via the peak current detection circuit, for example via the comparator circuit.

After such detection, for example by sending a peak detect interrupt, the diagnostic circuit, for example by means of a microcontroller that receives the interrupt and by means of a voltage sampling circuit on the shunt, samples the current circulating in the solenoid, and in particular its rate of change Ka' over time (di/dt) (step 402).

In one embodiment, the value of such gradient Ka' is compared with a predetermined value Ka.

If the gradient of the current in the solenoid is negative, it means that the movable core continues its movement with a dynamic proportional to the value Ka' of the gradient itself.

The derivative of the current over time (di/dt) is calculated continuously, sampling the current in a time range contiguous to the one wherein the waveform peak occurred.

In one embodiment, in the event of a null or positive value of the derivative of the current (di/dt) (step 404), the time value Ta corresponding to this value (step 406) is stored, for example by the microcontroller.

The calculation of the derivative of the current over time (di/dt) continues in order to determine if the gradient remains negative (step 408).

In one embodiment, the average value of such derivative, in this observation phase, may be stored in the parameter Kb' and compared with a second reference value Kb.

If the gradient Kb' always remains positive, it means that the point of the waveform at the moment Ta previously detected was an absolute minimum point, i.e., the point IVALLEY, and therefore the moment Ta coincides with the moment T2 (step 410).

In one embodiment, in the event of a second null or positive value ox the current derivative (di/dt) (step 412), the time value Tb corresponding to such value (step 414) is stored, for example by the microcontroller.

Note that, the values for the time moments Ta, Tb and the gradients Ka' and Kb' are initialized to zero for each solenoid activation.

The simultaneous presence, after the detection of the current peak, of two non-null values Ta and Tb and/or at least one of the values of the detected gradients Ka', Kb' less, in absolute value, than the predetermined value Ka, Kb indicates that during the movement of the movable core a discontinuity in the displacement dynamics occurred, due to friction.

As regards the gradients Ka' and Kb', in particular, a value that is negative but less, in absolute value, than the predetermined values Ka, Kb indicates that the slope of the descending segment of the curve is less than a predetermined slope due to the presence of friction in the stroke of the movable core.

The diagnostic circuit thus generates an alarm signal (step 416).

As mentioned above, in one embodiment the diagnostic device is implemented on the power supply and control circuit board 120 of the solenoid valve and is suitable to communicate with an external control unit, such as a PLC, using a communication protocol based on a single diagnostic cable 12b, which becomes the third cable of the solenoid valve, in addition to the two power cables 124.

Figure 8:
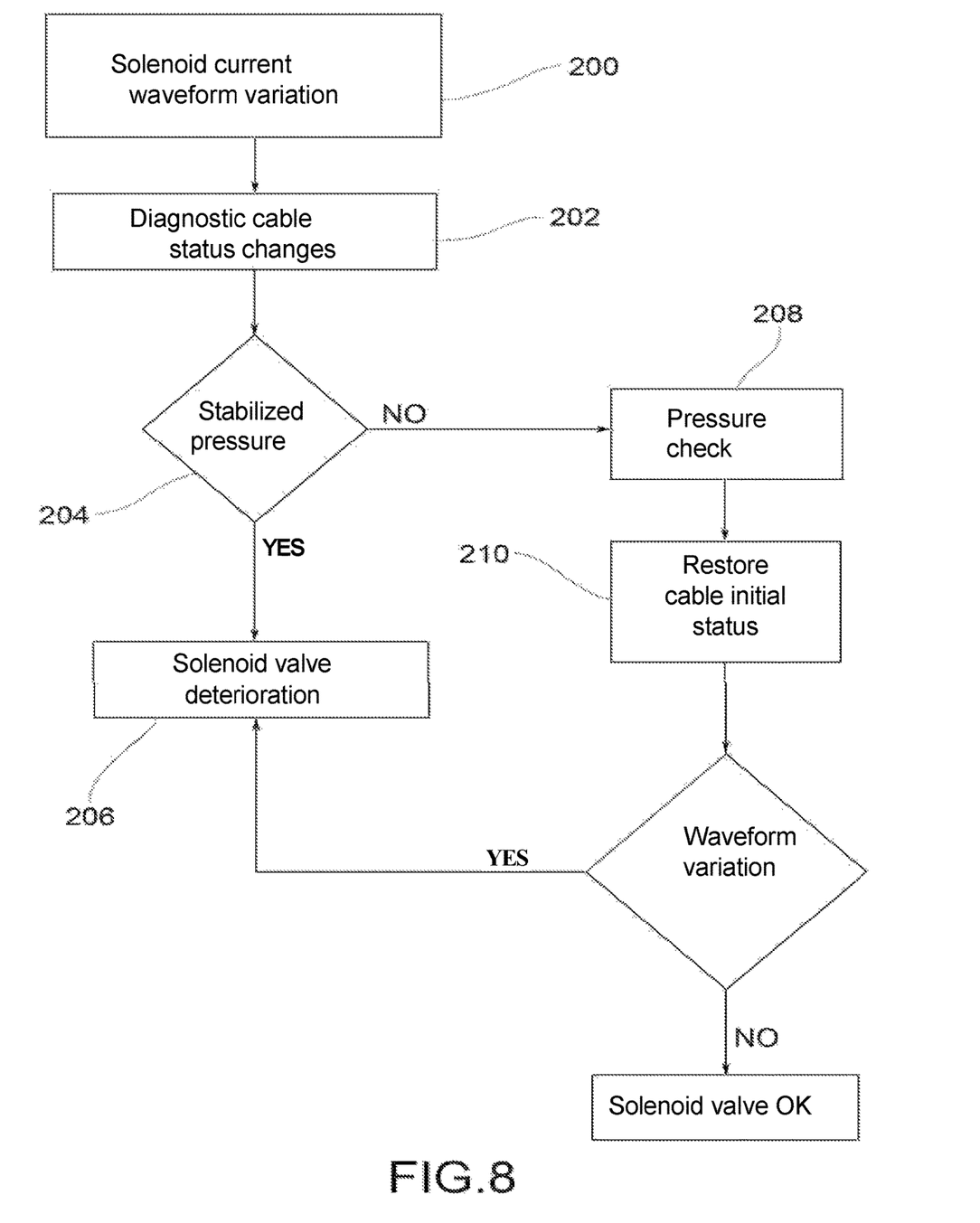
FIG. 8 is a flow diagram of a diagnostic algorithm, in another embodiment.

The flow diagram in FIG. 8 shows an example of a diagnostic protocol between the diagnostic circuit of the solenoid valve and the PLC.

The diagnostic circuit detects a change in the waveform of the solenoid current (step 200), for example by means of one of the detection modes described above; then, the diagnostic circuit changes the status level of the diagnostic cable, for example from low to high (step 202).

When the PLC receives this alarm signal from the diagnostic circuit, it checks if the pressure is stable (step 204). If the PLC has information that the system pressure has stabilized, then an alarm signal is given relative to a deterioration of the solenoid valve (step 206).

If, on the other hand, the PLC does not have pressure information on the stabilized system, then the PLC checks the system pressure (step 208) and commands the solenoid valve to restore the initial level of the diagnostic cable (step 210).

If, as a result of pressure monitoring, the diagnostic circuit still detects a change in the waveform of the solenoid current, then the diagnostic algorithm may conclude that the solenoid valve is deteriorating.

If, on the other hand, the waveform is within the parameters of the reference waveform, then the solenoid valve is operating correctly.

According to another aspect of the invention, the solenoid valve is equipped with a microcontroller-based electronic diagnostic circuit able to predict a malfunction of the solenoid valve by monitoring the solenoid current, according to one of the modes described above, and the supply voltage. Unlike other known diagnostic methods, no position sensor is required.

In one embodiment, the microcontroller of the electronic diagnostic circuit communicates with an external control unit, such as a PLC, through a single diagnostic cable that may assume two or more logical levels.

In a preferred embodiment, the electronic diagnostic circuit 30 is implemented on the same power supply and control circuit board 120 as the solenoid valve and is therefore powered by the same power source that supplies the solenoid of the solenoid valve.

Figure 9:
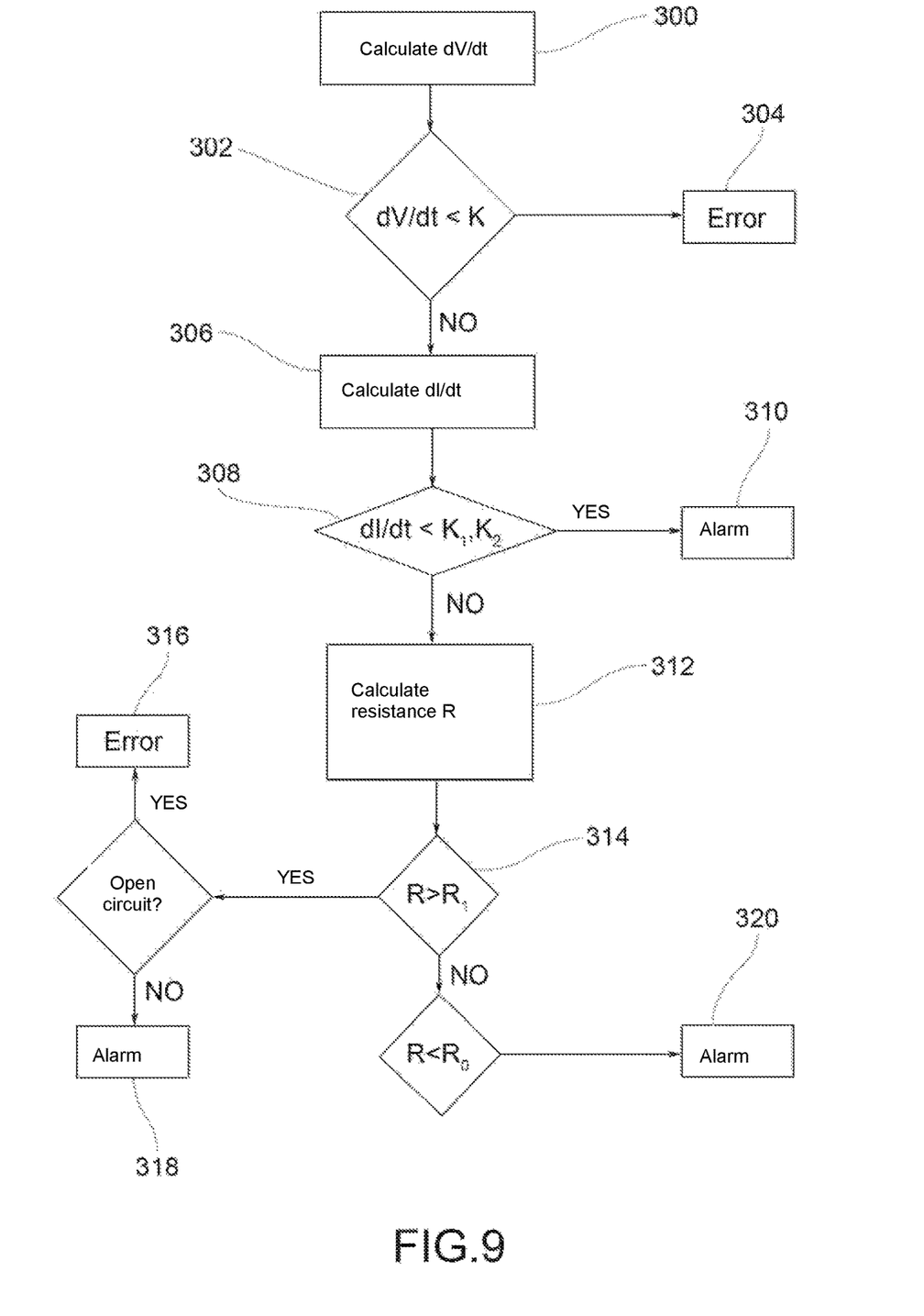
FIG. 9 is a flow diagram of a diagnostic algorithm, in another embodiment.

With reference to the flow diagram in FIG. 9, the microcontroller, when the power supply and diagnostic circuit is switched on, samples, for example by means of a sampling circuit, the supply voltage to the solenoid, and in particular its rate of change over time (dV/dt), to check whether it respects the predetermined trend (step 300). Such gradient is then compared with a predetermined value K (step 302).

If the gradient of the supply voltage is zero or less than the predetermined value K, it means that the solenoid is not correctly powered, and an error signal is sent (step 304).

If instead the solenoid is powered correctly, the microcontroller detects the peak and the valley of the waveform of the solenoid current and calculates the derivative of the current over time (dI/dt) in a time range that includes or is contiguous to the one wherein the peak and valley of the waveform occur (step 306).

Such derivatives, which represent the rate of change of the solenoid current, are then compared with the respective predetermined values K1, K2 (step 308). If the values of the derivatives are equal to zero (which indicates that the curve does not have any descending segment) or in any case less than the respective predetermined values K1, K2 (which indicates that the descending segment is too low due to friction in the stroke of the movable core), the microcontroller generates an alarm signal (step 310).

If the diagnostic microcontroller is connected, for example via a diagnostic cable, to an external control unit, for example a PLC, the alarm signal is sent to such unit and a pressure control algorithm may be started, as described previously with reference to the algorithm in FIG. 8. The PLC then checks whether the pressure is stable. If this is the case, then the PLC or the diagnostic microcontroller generates an alarm signal relating to a deterioration of the solenoid valve.

If, on the other hand, the PLC does not have pressure information for the stabilized system, then the PLC checks the system pressure and commands the diagnostic circuit of the solenoid valve to repeat the calculation of the rate of change of the solenoid current. If, following the pressure check, the diagnostic circuit still detects values of the current derivatives over time equal to zero or in any case less than the respective predetermined values K1, K2, then the diagnostic algorithm may conclude that the solenoid valve is deteriorating. If, however, the values of the derivatives are equal to or greater than the predetermined values K1, K2, then the solenoid valve is working correctly.

If, on the other hand, the diagnostic microcontroller is not connected to an external control unit, a visual indication of the anomalous operating status may be given, for example, by flashing an LED at a certain frequency.

In one embodiment, the derivatives of the waveform of the solenoid current are compared with the value of the derivatives calculated in a test phase of the solenoid valve during or after its release from the factory, or at the beginning of its life cycle, so as to detect any significant variations caused by the wear of the solenoid valve, as explained above.

In a variant embodiment, the derivatives of the waveform are compared with the values of the derivatives calculated in the previous excitation of the solenoid valve (or with average values relating to a certain number of previous excitations).

In a variant embodiment, to detect any changes in the waveform of the solenoid current, the diagnostic algorithm may use, instead of calculating the derivatives of the current, the simple calculation of the engagement time T1 of the movable core, and possibly the time (T2-T1) used by the movable core to perform its stroke, for example using one of the techniques described above. In particular, a single current peak detection circuit of the type described in FIG. 5 may also be used, even partially integrated in the diagnostic microcontroller.

In one embodiment, after the solenoid current has reached its steady state condition, the microcontroller also monitors the value of the resistance R of the solenoid, for example, by calculating the average value of the ratios between the voltage and the current, so as to detect conditions of short circuit, open circuit or other abnormal situations, such as overheating of the solenoid valve, to be communicated to the PLC.

In particular, according to one embodiment, the microcontroller calculates the value R0 of the solenoid resistance K at the first powering up of the solenoid valve, i.e., with the solenoid valve still cold. The microcontroller then monitors the resistance value during the solenoid valve work cycle and compares it with a predetermined limit value R1 defined as an acceptable heating of the solenoid (step 314). If the resistance value increases but remains below the predetermined value R1, then no anomalies are detected.

If, on the other hand, the solenoid resistance value R is greater than the predetermined value R1, an open circuit may have occurred in the solenoid valve, in which case the microcontroller sends an error signal (step 316), or an abnormal overheating, in which case the microcontroller sends an alarm signal (step 318).

If, on the other hand, the solenoid resistance value R decreases with respect to the initial value R0, then an anomaly has occurred, and the microcontroller sends an alarm signal (step 320).

Note that, depending on the type and severity of the malfunction detected, for example the solenoid valve wears out, or there is a short circuit or open circuit of the solenoid, the messages sent by the microcontroller may be alarm messages, which may be reset by the PLC, or error messages, which lead, for example, to the direct shutdown of the solenoid valve.

Obviously, the calculation of the solenoid resistance value R presupposes a constant supply voltage.

Figure 10:
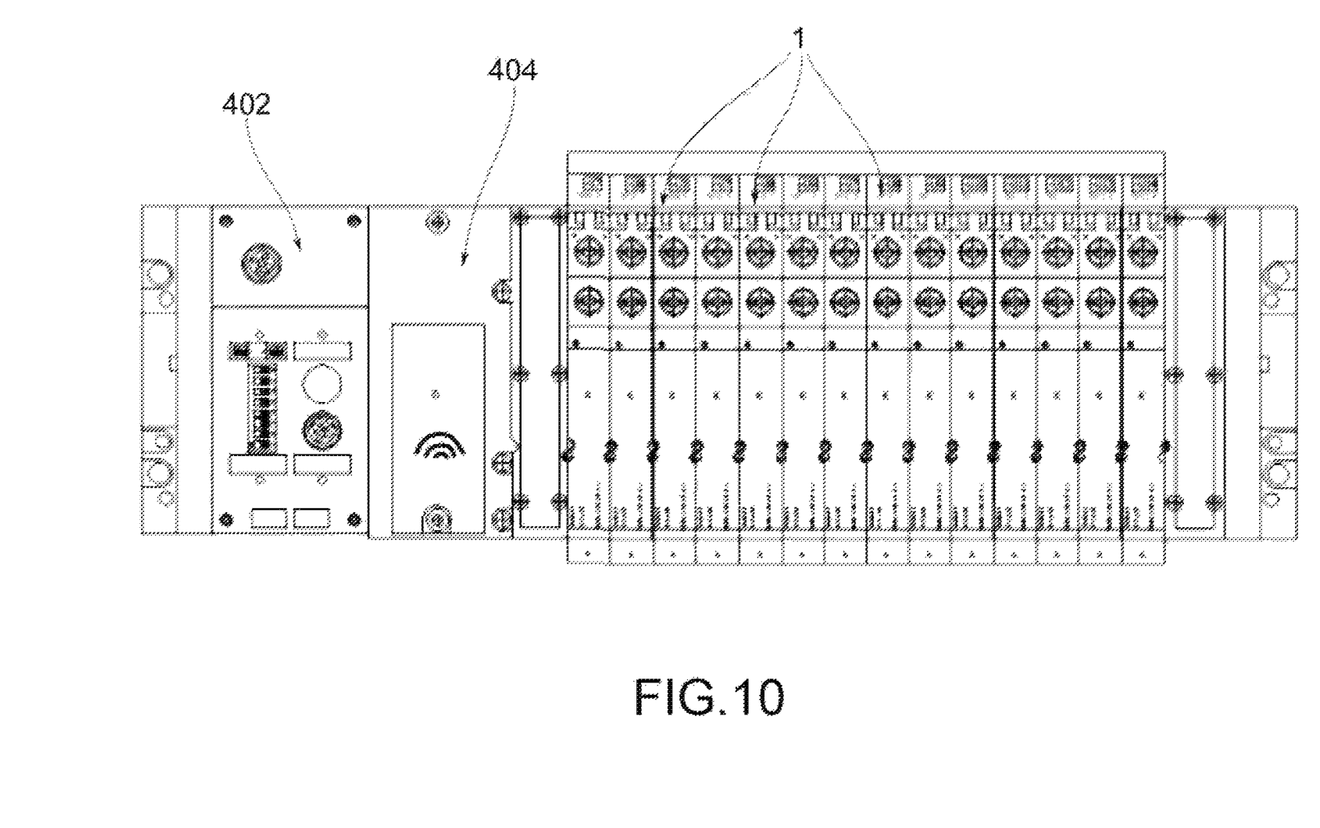
FIG. 10 is a plan view of a valve island equipped with a diagnostic and communication device according to the invention.

In the case of a valve island 400, as shown in FIG. 10, diagnostics may be carried out on individual solenoid valves 1 or on the entire island, i.e. by monitoring the current waveform common to all solenoid valves and analyzing variations with respect to the average value. It is therefore possible to determine the behavior of the solenoid valves by controlling the time that elapses between the excitation of each solenoid valve and the variation present on the common reference node of the solenoid valves.

In order to carry out diagnostics on each solenoid valve, the diagnostics algorithm must provide for an excitation of the solenoid valve in question in a time interval that does not compete with other events, for example when the other solenoid valves are not energized.

Alternatively, the diagnostic algorithm may establish a steady state condition for solenoid valve groups on the valve island, so as to detect anomalous absorption conditions of each solenoid valve group compared to a set of predetermined or pre-acquired values for that same steady state situation of the relative group.

In the case of valve islands 400, the diagnostic methods described above may provide for communication with an external control unit, such as a PLC, or may instead provide for communication of the outcome of diagnostic activities to the circuit board 402 that controls the valve island and which is integrated in the same island. For example, this circuit board 402 may be equipped with a series of LED signaling lights suitable to display the different causes of malfunction of the valve island.

In the case of communication with an external control unit, a wired or wireless diagnostic communication protocol may be provided. In this case, the microcontroller and the transmitter/receiver module 404 may be installed on the same power supply and control circuit board 402 for all the solenoid valves of the valve island.

Even in the case of connection between the diagnostic circuit of a single solenoid valve and an external control unit, the diagnostic cable mentioned above could be replaced by a wireless communication system, depending on the needs and technology available.

To the embodiments of the diagnostic device and method for solenoid valves according to the invention, one skilled in the art, to satisfy contingent needs, may make modifications, adaptations and replacements of some elements with others that are functionally equivalent, without departing from the scope of the following claims. Each of the features described as belonging to a possible embodiment may be implemented independently from the other described embodiments.

What is claimed is:

1. A diagnostic method for diagnosing a malfunction in a solenoid valve, wherein the solenoid valve comprises an electromagnet and a valve body wherein one or more orifices are provided for passage of a pressurized fluid, and wherein the electromagnet comprises a solenoid configured to be connected to a constant voltage generator generating in the solenoid a solenoid current, and a magnetic circuit comprising a movable core situated and slidable in the solenoid, the method comprising steps of:
   a) detecting, at excitation of the solenoid, a variation rate over time of a supply voltage of the solenoid and comparing the variation rate with a predetermined value;
   b) generating an error signal, if the variation rate is lower than the predetermined value, if not then,
   c) detecting characteristics of a waveform of the solenoid current over a time interval between a moment of excitation of the solenoid and a moment wherein the movable core reaches an end-stroke position;
   d) comparing the detected characteristics of the waveform with predetermined threshold values;
   e) generating an alarm signal, if the detected characteristics of the waveform are lower than the predetermined threshold values, if not then,
   f) calculating a value of solenoid resistance and comparing the value of the solenoid resistance with a predetermined minimum resistance value and with a predetermined maximum resistance value, when the solenoid current is in steady state; and
   g) generating an alarm signal, if the value of the solenoid resistance is lower than the predetermined minimum resistance value or greater than the predetermined maximum resistance value.

2. The method of claim 1, wherein step c) comprises calculating derivatives of the solenoid current over time in a time range that includes or is adjacent to moments of peak and valley of the waveform of the solenoid current, the peak and the valley being generated, respectively, by engagement of the movable core and attainment of the end-stroke position of the movable core, and wherein, in step d), values of the derivatives are compared with predetermined values.

3. The method of claim 1, wherein the characteristics of the waveform of the solenoid current comprise a first time interval that elapses between the moment of excitation of the solenoid and a moment of peak current generated by engagement of the movable core.

4. The method of claim 1, wherein step c) comprises:
   verifying if the waveform of the solenoid current has, between peak and valley of the waveform of the solenoid current, where the peak and the valley are generated, respectively, by engagement of the movable core and attainment of the end-stroke position of the movable core, a relative inflection point, and/or further relative minimum and maximum points; and
   calculating average values of derivatives of the solenoid current over time in a time interval immediately preceding and in a time interval immediately following the relative inflection point or minimum point;
   and wherein step (d) comprises:
   comparing the average values of the derivatives with corresponding reference values; and
   verifying whether at least one of the average values of the derivatives is lower in absolute value than the corresponding reference value.

5. The method of claim 4, wherein a presence of the relative inflection point and/or the further relative maximum and minimum points is detected by calculating derivatives of the solenoid current over time and verifying if the derivatives assume a null or positive value in two moments of time in a time interval subsequent to a moment wherein the peak of the waveform is verified and before the solenoid current reaches a steady state value.

6. The method of claim 1, wherein the predetermined threshold values are obtained by the waveform of the solenoid current acquired when the solenoid valve is in a testing stage during or after release from a factory.

7. The method of claim 1, wherein the predetermined threshold values are obtained from mean values relating to a previously acquired set of values of the waveform of the solenoid current.

8. The method of claim 1, wherein, if at step e) the detected characteristics of the waveform are lower than the predetermined threshold values, the following is performed:
   e1) a comparison between a pressure value of fluid entering an inlet orifice of the solenoid valve and a range of predetermined pressure values, and
   e2) in an event of deviation of the pressure value with respect to the range of predetermined pressure values, an adjustment of the pressure value of the fluid and a repetition of steps c) and d).

9. A diagnostic device for diagnosing the malfunction in the solenoid valve, wherein the solenoid valve comprises the electromagnet and the valve body wherein the one or more orifices are provided for the passage of the pressurized fluid, and wherein the electromagnet comprises the solenoid configured to be connected to the constant voltage generator generating in the solenoid the solenoid current, and the magnetic circuit comprising the movable core, situated and slidable in the solenoid, the diagnostic device comprising an electronic diagnostic circuit with a microcontroller configured to implement the diagnostic method of claim 1.

10. The diagnostic device of claim 9, wherein the electronic diagnostic circuit is implemented on a power supply and control circuit board configured to be mounted on the solenoid valve.

11. The diagnostic device of claim 9, further comprising communication means to implement communication between the microcontroller of the electronic diagnostic circuit and an external control unit.

12. The diagnostic device of claim 11, wherein said communication means transmit a status signal to the external control unit, which may assume at least two logical levels representative of an operational state of the solenoid valve.

13. The diagnostic device of claim 9, wherein the electronic diagnostic circuit comprises a current sampling circuit to sample the waveform at predetermined time intervals.

14. The diagnostic device of claim 9, wherein the electronic diagnostic circuit comprises an analog peak detection circuit comprising an operational amplifier with comparator function, an inverting input terminal of which receives the solenoid current detected through a shunt resistor and a non-inverting input terminal of which receives the solenoid current to which is applied a delay given by an RC network.

15. The solenoid valve comprising the electromagnet and the valve body wherein the one or more orifices are provided for the passage of the pressurized fluid, and wherein the electromagnet comprises the solenoid configured to be connected to the constant voltage generator generating in the solenoid the solenoid current, and the magnetic circuit comprising the movable core situated and slidable in the solenoid, the solenoid valve further comprising the diagnostic device of claim 9.

16. The solenoid valve of claim 15, further comprising a power supply and control circuit board, the diagnostic device being implemented on the power supply and control circuit board.

17. The solenoid valve of claim 16, wherein the power supply and control circuit board is provided with an electrical connector having a pair of power supply terminals and an electrical diagnostic terminal connectable to an external control unit.

18. A solenoid valve island, comprising a power supply and control circuit board for all solenoid valves of the solenoid valve island, the power supply and control circuit board comprising an electronic diagnostic circuit with a microcontroller configured to implement the diagnostic method of claim 1, wherein the predetermined threshold values are related to each of the solenoid valves of the solenoid valve island or groups of solenoid valves of the solenoid valve island, and wherein the detected characteristics of the waveform of the solenoid current are obtained by exciting separately each solenoid valve or each group of solenoid valves.

* * * * *